(12) United States Patent
Lin et al.

(10) Patent No.: US 6,316,368 B1
(45) Date of Patent: Nov. 13, 2001

(54) METHOD OF FABRICATING A NODE CONTACT

(75) Inventors: Kwang-Ming Lin, Hsinchu; Tzu-Min Peng, Chupei; Chieh-Te Chen, Kaohsiung; Pang-Miao Liu, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/286,080

(22) Filed: Apr. 5, 1999

(51) Int. Cl.[7] ................................................. H01L 21/302
(52) U.S. Cl. ..................... 438/720; 438/723; 438/724; 438/733
(58) Field of Search ..................... 438/710, 719, 438/720, 721, 722, 723, 724, 733

(56) References Cited

U.S. PATENT DOCUMENTS

| | | | | |
|---|---|---|---|---|
| 5,792,692 | * | 8/1998 | Li et al. | 438/253 |
| 5,837,577 | * | 11/1998 | Cherng | 438/253 |
| 5,893,734 | * | 4/1999 | Jeng et al. | 438/239 |
| 5,895,239 | * | 4/1999 | Jeng et al. | 438/239 |
| 5,972,789 | * | 10/1999 | Jeng et al. | 438/637 |
| 6,187,626 | * | 2/2001 | Sze | 438/253 |
| 6,214,727 | * | 4/2001 | Parekh | 438/666 |
| 6,255,224 | * | 7/2001 | Kim | 438/723 |

* cited by examiner

Primary Examiner—Benjamin L. Utech
Assistant Examiner—Charlotte A. Brown
(74) Attorney, Agent, or Firm—Jiawei Huang; J.C. Patents

(57) ABSTRACT

A method of fabricating a node contact opening is described. A dielectric layer is formed on a substrate. A first conductive layer is formed on the dielectric layer. The first conductive layer is etched to form a trapezoidally cross-sectioned opening exposing a portion of the dielectric layer. The dielectric layer exposed by the trapezoidally cross-sectioned opening is etched to form a node contact opening in the dielectric layer exposing a part the substrate. A second conductive layer is formed to fill the node contact opening and in contact with the conductive layer.

13 Claims, 3 Drawing Sheets

METHOD OF FABRICATING A NODE CONTACT

BACKGROUND OF THE INVENTION

1. Field of the Invention

The present invention relates to a semiconductor fabricating method. More particularly, the present invention relates to a method of forming a node contact.

2. Description of the Related Art

A dynamic random access memory (DRAM) is a memory circuit that is most often used in computers and electronic products. Due to the development of the industry, there is a correspondingly greater need for high-capacity DRAM.

In a memory cell of a DRAM, a node contact is used to connect a capacitor and a transistor. The steps of forming the node contact include etching a dielectric layer on a substrate to form a node contact opening that exposes a part of the substrate, and filling the node contact opening with a conductive layer to form a conductive plug. In order to prevent electrical connection between the conductive plug and bit lines, the width of the conductive plug must be shorter than the distance between the bit lines. In this manner, a reserved tolerance window is obtained. When the node contact opening is patterned, the tolerance of the step needs to be within the range of the tolerance window so as to prevent the conductive plug from making contact with the bit lines. However, as the integration of semiconductor devices increases, the linewidth of the semiconductor devices is decreased. The limitation of the photolithography and etching process prevents the size of node contact opening from being further reduced. In a semiconductor fabrication process with a linewidth lower than 0.2 micrometers, the range of the tolerance window is especially insufficient when forming the node contact opening by the conventional method. This, in turn, causes the contact plug to make contact with the bit line and leads to shorts in devices.

There are two conventional methods to solve the above-described problems. The first method is to form an etching stop layer on the bit lines. During the step of etching the node contact opening, the etching stop layer prevents the bit lines from being etched. However, the method for forming the node contact opening is complicated and easily degrades the product quality. Thus, this method does not benefit the formation of the node contact opening.

Another method solves the problem by adjusting the etching parameters to form a node contact opening. The width of the node contact opening gradually decreases from the top to the bottom. Because the width of the node contact opening gradually decreases from the top to the bottom, the width of the node contact opening between the bit lines is shorter than the width at the surface of the dielectric layer. An electrical connection between the conductive plug and the bit lines does not occur. However, the increase in the width of the reserved tolerance window by this method is limited. The conductive plug still easily makes contact with the bit lines. The quality of the semiconductor devices formed by this method is still poor.

FIG. 1 is a schematic, cross-sectional view of a portion of a semiconductor device showing a conventional node contact.

Referring to FIG. 1, a substrate 100 including a gate 110, a dielectric layer 102, a bit line 106, and a dielectric layer 104 is provided. The dielectric layers 102 and 104 are patterned. A trapezoidally cross-sectioned opening 112 is formed to expose a part of the substrate 100. The width of the trapezoidally cross-sectioned opening 112 gradually decreases from the top to the bottom, which gives the profile of the opening 112 its trapezoidal shape. A conductive plug 114 is formed to fill the trapezoidally cross-sectioned opening 112 and cover a portion of the dielectric layer 104, so as to form a node contact. The node contact formed by this method has smaller width between the bit lines 106 compared with a node contact formed from a vertical-sidewall opening, in order to prevent the node contact from making contact with the bit lines 106. However the width reduction is not great, and thus a wider reserved tolerance window cannot be further provided. Device shorts caused by electrical connection between the conductive plug 114 of the node contact and the bit line 106 still occur.

SUMMARY OF THE INVENTION

The invention provides a method of fabricating a node contact opening. A dielectric layer is formed on a substrate. A first conductive layer is formed on the dielectric layer. Portions of the first conductive layer are removed until the dielectric layer is exposed to leave a remaining first conductive layer as a portion of the contact node. The dielectric layer beside the remaining first conductive layer comprising a cross-sectionally trapezoidal opening formed therein is exposed. The cross-sectionally trapezoidal opening is formed though the first conductive layer to expose a portion of the dielectric layer. A width of the cross-sectionally trapezoidal opening gradually decreases from top to bottom. A portion of the dielectric layer exposed by the cross-sectionally trapezoidal opening is removed to form a node contact opening in the dielectric layer until a part the substrate is exposed. A sidewall of the node contact opening is perpendicular to a surface of the substrate. A second conductive layer is formed on the remaining first conductive layer to fill the cross-sectionally trapezoidal opening and the node contact opening.

The present invention forms the cross-sectionally trapezoidal opening in the first conductive layer. The dielectric layer is etched with the remaining first conductive layer serving as an etching mask to form the node contact opening. In this manner, a reserved tolerance window with a wider range is obtained. Hence, the invention prevents electrical connection between the conductive plug and the bit lines and also prevents shorts in devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
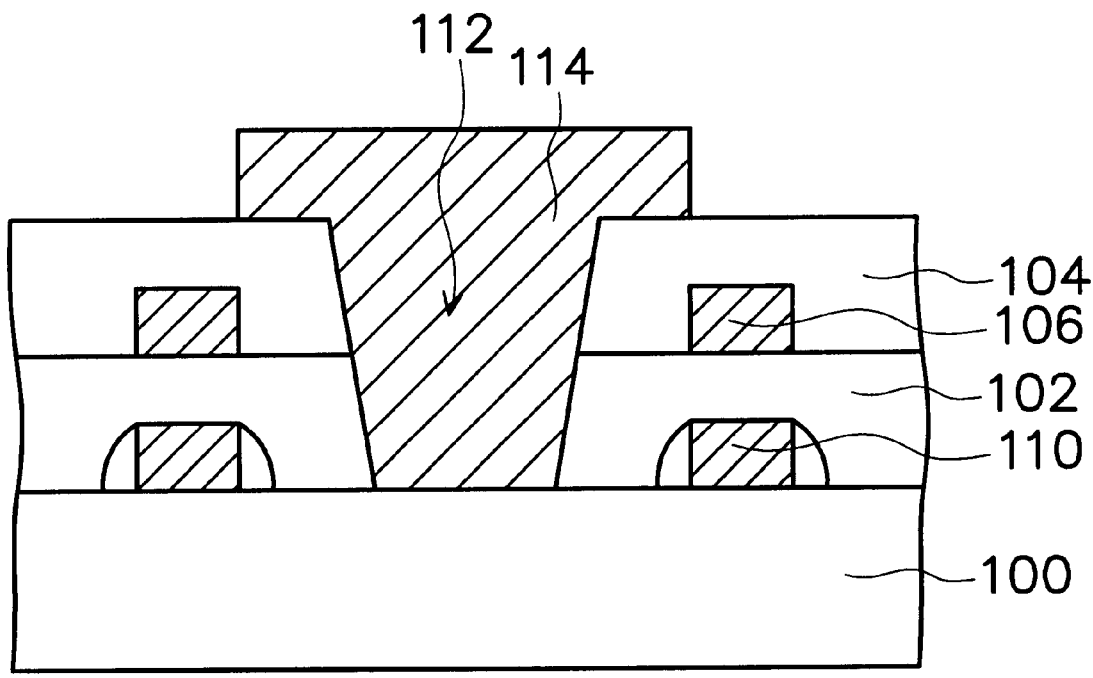
FIG. 1 is a schematic, cross-sectional view of a portion of a semiconductor device showing a conventional node contact.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
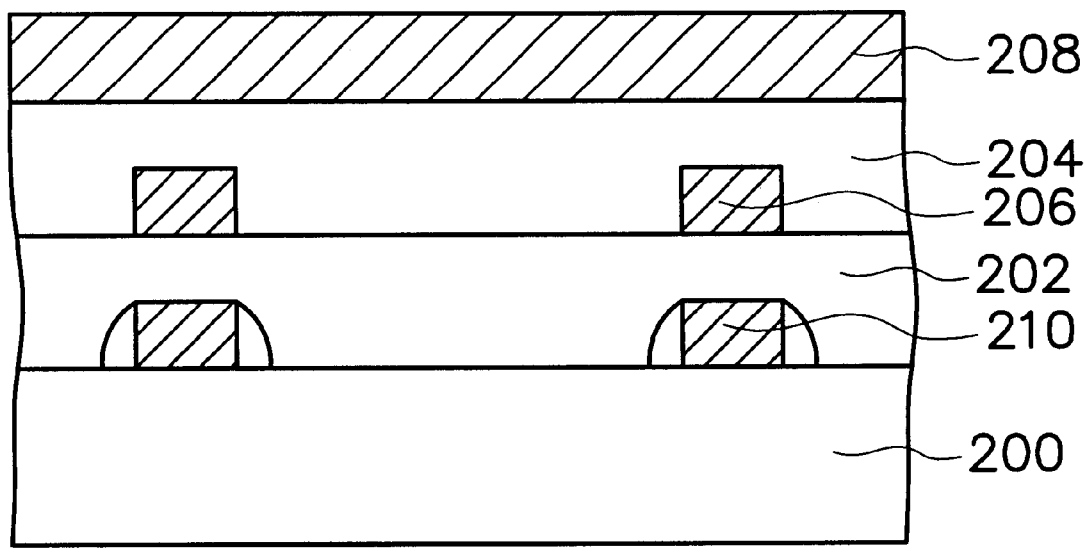
FIGS. 2A through 2D are schematic, cross-sectional views showing a method of fabricating a node contact according to one preferred embodiment of the invention.

Referring to FIG. 2A, a substrate 200 including a gate 210, a dielectric layer 202, a dielectric layer 204, and a bit line 206 is provided. A conductive layer 208 is formed on the dielectric layer 204. The material of the conductive layer 208 includes polysilicon. The conductive layer 208 is formed by, for example, chemical vapor deposition.

Figure 2B:
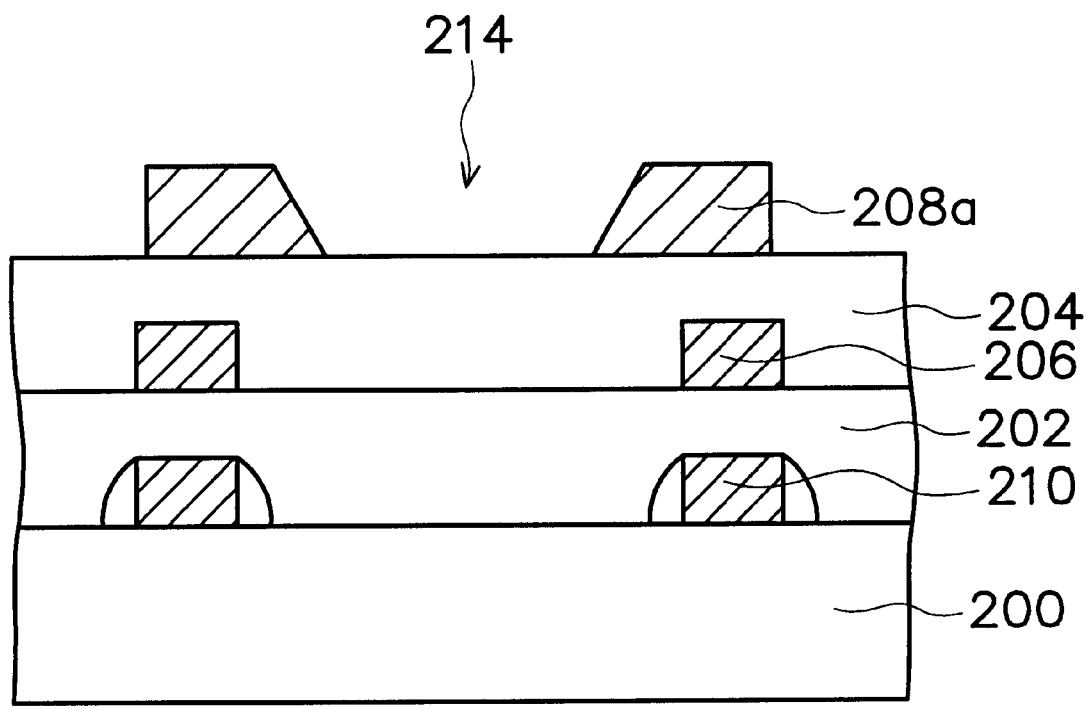

In FIG. 2B, an etching step is performed to etch the conductive layer 208. The etching step provides a high etching selectivity between the conductive layer 208 and the dielectric layers 202 and 204. The etching rate for the conductive layer 208 is higher than the etching rate for the dielectric layers 202 and 204. A trapezoidally cross-sectioned opening 214 is formed through the conductive layer 208 to expose a portion of the dielectric layer 204 and leave a conductive layer 208a on the dielectric layer 204. The dielectric layer 204 beside the conductive layer 208a including the trapezoidally cross-sectioned opening 214 formed therein is exposed. The conductive layer 208a is used as a portion of a contact node (shown in FIG. 2D). A width of the trapezoidally cross-sectioned opening 214 gradually decreases from top to bottom. The trapezoidally cross-sectioned opening 214 has a slanted sidewall. The width of the trapezoidally cross-sectioned opening 214 on the dielectric layer 204 is shorter than the width of the trapezoidally cross-sectioned opening 214 between the bit line 206 and a neighboring bit line 206. The trapezoidally cross-sectioned opening 214 has a minimum width on a surface the dielectric layer 204.

The trapezoidally cross-sectioned opening 214 preferably is formed by the following exemplary steps. A surface treatment step is performed by plasma for 10 seconds. The plasma is generated from a $CF_4$ source gas with a power of 500 W, and the plasma has a total pressure of 4 mT and a flow rate of 45 sccm. In the surface treatment step, a native oxide layer or the impurities on the substrate 200 are removed. A bulk etching step is performed by plasma. The plasma is generated from a mixed gas with a power of 1000 W. The mixed gas includes a $Cl_2$ gas having a flow rate of 70 sccm, a HBr gas having a flow rate of 70 sccm, a $CF_4$ gas having a flow rate of 23 sccm, and a $HeO_2$ gas having a flow rate of 12 sccm. A main etching step is performed by plasma for 62 seconds. The plasma is generated from a mixed source gas with a power of 1000 W. In the main etching step, a $Cl_2$ gas having a flow rate of 50 sccm and a HBr gas having a flow rate of 150 sccm are mixed to form the mixed source gas having a total pressure of 4 mTorr. An over-etching step is performed by plasma for 90 seconds. In the over-etching step, the plasma is generated from a mixed source gas with a power of 400 W. The mixed source gas includes a HBr gas having a flow rate of 108 sccm and a $HeO_2$ gas having a flow rate of 8 sccm.

Figure 2C:
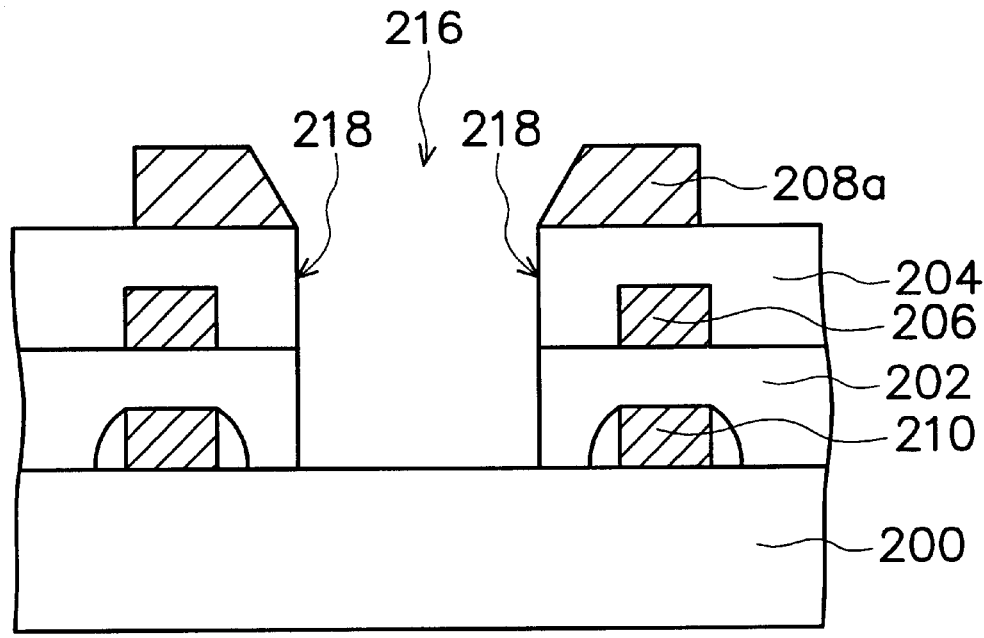

In FIG. 2C, an etching step, such as an anisotropic etching step, is performed on the dielectric layers 202 and 204 with the conductive layer 208a serving as a mask. A node contact opening 216 is formed through the dielectric layers 202 and 204. The sidewall 218 of the node contact opening 216 is perpendicular to the surface of the substrate 200. Because the width of the node contact opening 216 is the same as the minimum width of the trapezoidally cross-sectioned opening 214 and the minimum width of the trapezoidally cross-sectioned opening 214 is shorter than the distance between the bit line 206 and the neighboring bit line 206, a distance between the sidewall of the node contact opening 216 and the bit lines 206 is reserved. The reserved distance mentioned above is called a reserved tolerance window. When fabricating a node contact opening 216, the range of the tolerance window is wider than the range of the conventional method, so that the node contact opening 216 does not make contact with the bit lines 206.

The steps for forming the node contact opening 216 include the following exemplary steps. A surface treatment step is performed by plasma, which is generated from a mixed source gas with a power of 1700 W, for 3 hours. The mixed source gas having a total pressure of 35 mTorr includes a CO gas having a flow rate of 340 sccm and a $CF_3$ gas having a flow rate of 50 sccm. In the surface treatment step, a native oxide layer or the impurities on the substrate 200 are removed. A bulk etching is performed by plasma for 15 minutes. In the bulk etching step, the plasma is generated from a mixed source gas with a power of 500 W. The mixed source gas having a total pressure of 55 mTorr includes a mixture of an argon (Ar) gas having a flow rate of 100 sccm, an $O_2$ gas having a flow rate of 20 sccm, and a $CF_3$ gas having a flow rate of 20 sccm. A main etching step is performed by plasma for 80 minutes. The plasma is generated from a mixed source gas with 1600 W. In the main etching step, a $C_4F_8$ gas having a flow rate of 20 sccm, an Ar gas having a flow rate of 350 sccm, and an $O_2$ gas having a flow rate of 10 sccm are mixed to form the mixed source gas having a total pressure of 35 mTorr. An over-etching step is performed by plasma for 10 minutes. In the over-etching step, the plasma is generated from a mixed source gas includes mixture of an Ar gas having a flow rate of 100 sccm, an $O_2$ gas having a flow rate of 20 sccm, and a $CF_3$ gas having a flow rate of 20 sccm.

Figure 2D:
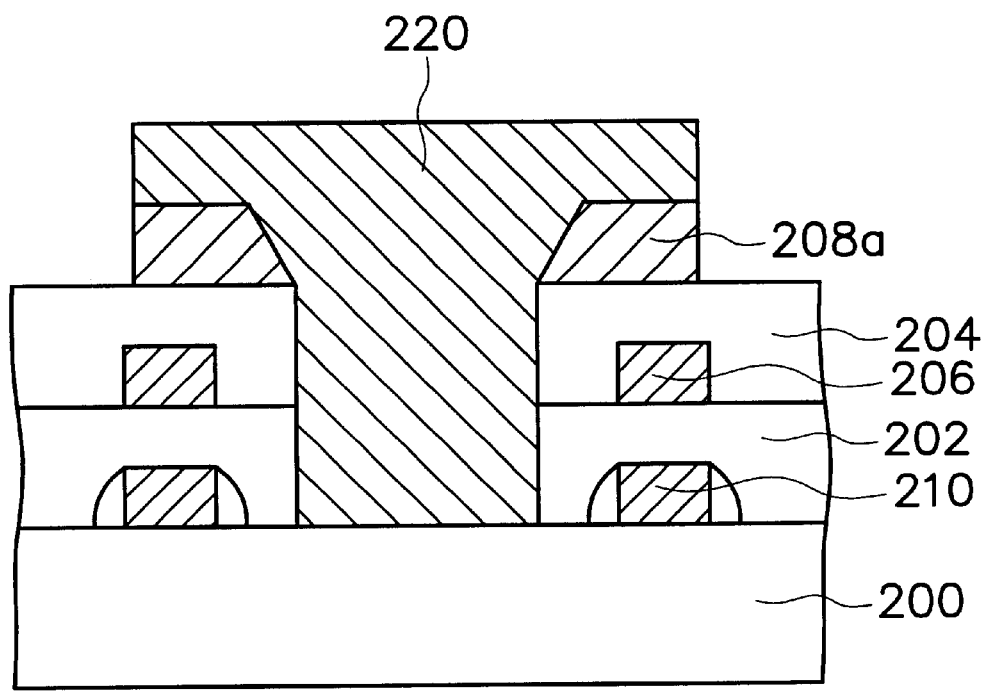

In FIG. 2D, a conductive layer 220 is formed on the conductive layer 208a to fill the trapezoidally cross-sectioned opening 214 and the node contact opening 216. The node contact thus is completed. The steps of forming the conductive layer 220 includes forming a conductive material layer (not shown) on the conductive layer 208a and the dielectric layer 214 to fill the node contact opening 216, and removing a portion of the conductive material layer to form the conductive layer 220. The material of the conductive layer 220 includes polysilicon.

In the present invention, the conductive layer 208 having a higher etching rate than the dielectric layer 204 is formed on the dielectric layer 204. The conductive layer 208 is etched with specific parameters to form the cross-sectionally trapezoidal opening 214 through the remaining conductive layer 208a. The dielectric layers 202 and 204 are etched to form the node contact opening 216 with the conductive layer 208a serving as an etching mask. In the present invention, not only the width of the node contact opening 216 is the same as the minimum width of the trapezoidally cross-sectioned opening 214 but also the minimum width of the trapezoidally cross-sectioned opening 214 is shorter than the distance between the bit line 206 and the neighboring bit line 206. Thus, in comparison with the conventional method, the present invention provides a wider reserved tolerance window between the sidewall of the node contact 216 and the bit lines 206. The electrical connection between the node contact opening 216 and the bit line 206 as well as shorts in devices do not occur.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a node contact, comprising the steps of:

forming a dielectric layer on a substrate;

forming a first conductive layer on the dielectric layer;

forming a cross-sectionally trapezoidal opening which exposes a part of the dielectric layer by removing portions of the first conductive layer, wherein the cross-sectionally trapezoidal opening has a width gradually decreasing from top to bottom and the remaining first conductive layer becomes a part of the node contact;

forming a node contact opening by removing a portion of the dielectric layer exposed by the cross-sectionally trapezoidal opening until a part the substrate is exposed, wherein a sidewall of the node contact opening is perpendicular to a surface of the substrate; and forming a second conductive layer on the remaining first conductive layer and to fill the cross-sectionally trapezoidal opening and the node contact opening.

2. The method of claim 1, wherein the cross-sectionally trapezoidal opening has a minimum width on a surface of the dielectric layer.

3. The method of claim 1, wherein the steps of forming the cross-sectionally trapezoidal opening comprise:

performing a surface treatment step by plasma for 10 seconds with a power of 500 W, wherein the plasma is generated from a $CF_4$ source gas, which has a flow rate of 45 sccm and a total pressure of 4 mTorr;

performing a bulk etching step by plasma, wherein the plasma is generated from a mixed source gas with a power of 1000 W, and the source gas comprises a $Cl_2$ gas having a flow rate of 70 sccm, a HBr gas having a flow rate of 70 sccm, a $CF_4$ gas having a flow rate of 23 sccm, and a $HeO_2$ gas having a flow rate of 12 sccm;

performing a main etching step by plasma for 62 seconds, wherein the plasma is generated from a mixed source gas with a power of 1000 W, and the mixed source gas having a total pressure of 4 mTorr comprises a $Cl_2$ gas having a flow rate of 50 sccm and a HBr gas having a flow rate of 150 sccm; and performing an over-etching step by plasma for 90 seconds, wherein the plasma is generated from a mixed source gas with a power of 400 W, and the mixed source gas having a total pressure of 60 mTorr comprises a HBr gas having a flow rate of 108 sccm and a $HeO_2$ having a flow rate of 8 sccm.

4. The method of claim 1, wherein the steps of forming the second conductive layer comprise:

forming a conductive material layer on the first conductive layer and the dielectric layer to fill the cross-sectionally trapezoidal opening and the node contact opening; and removing a portion of the conductive material layer to leave the second conductive layer on the remaining first conductive layer.

5. The method of claim 1, wherein the material of the second conductive layer comprises polysilicon.

6. The method of claim 1, wherein the step of forming the node contact opening comprises anisotropic etching with the remaining first conductive layer serving as an etching mask.

7. The method of claim 6, wherein the steps of performing the anisotropic etching comprise:

performing a surface treatment step by plasma for 3 hours, wherein the plasma is generated from a mixed source gas having a total pressure of 35 mTorr with a power of 1700 W, and the mixed source gas comprises a CO gas having a flow rate of 340 sccm and a $CF_3$ gas having a flow rate of 50 sccm;

performing a bulk etching by plasma for 15 minutes, wherein the plasma is generated from a mixed source gas with a power of 500 W, and the source gas having a total pressure of 55 mTorr comprises an argon gas having a flow rate of 100 sccm, a $O_2$ gas having a flow rate of 20 sccm, and a $CF_3$ gas having a flow rate of 20 sccm;

performing a main etching step by plasma for 80 minutes, wherein the plasma is generated from a mixed source gas having a total pressure of 35 mTorr with a power of 500 W, wherein the mixed source gas comprises a $C_4F_8$ gas having a flow rate of 20 sccm, an argon gas having a flow rate of 350 sccm, and an $O_2$ gas having a flow rate of 10 sccm; and performing an over-etching step by plasma for 10 minutes, wherein the plasma is generated from a mixed source gas having a total pressure of 100 mTorr with a power of 500 W, and the mixed source gas comprises an argon gas having a flow rate of 100 sccm, an $O_2$ gas having a flow rate of 20 sccm, and a $CF_3$ gas having a flow rate of 20 sccm.

8. The method of claim 1, wherein the first conductive layer is formed by chemical vapor deposition.

9. The method of claim 1, wherein the step of removing the first conductive layer comprises an etching step having a higher etching rate for the conductive layer than for the dielectric layer.

10. A method of forming a node contact opening comprising:

forming a dielectric layer on a substrate;

forming a conductive layer on the dielectric layer;

removing portions of the conductive layer until the dielectric layer is exposed to leave a remaining first conductive layer as a portion of the contact node, wherein a cross-sectionally trapezoidal opening is formed within the remaining first conductive layer, a width of the cross-sectionally trapezoidal opening gradually decreases from top to bottom and a bottom width of the cross-sectionally trapezoidal opening is at least less than a distance between neighboring bitlines located in the dielectric layer; and performing an anisotropic etching step to remove the dielectric layer exposed by the trapezoidally cross-sectioned opening until the substrate is exposed, wherein the anisotropic etching step is performed with the remaining conductive layer serving as an etching mask.

11. The method of claim 10, wherein the steps of forming the trapezoidally cross-sectioned opening comprise:

performing a surface treatment step by plasma for 10 seconds, wherein the plasma is generated from a $CF_4$ source gas, which has a flow rate of 45 sccm and a total pressure of 4 mTorr, with a power of 500 W;

performing a bulk etching step by plasma, wherein the plasma is generated from a mixed source gas with a power of 1000 W, and the source gas comprises a $Cl_2$ gas having a flow rate of 70 sccm, a HBr gas having a flow rate of 70 sccm, a $CF_4$ gas having a flow rate of 23 sccm, and a $HeO_2$ gas having a flow rate of 12 sccm;

performing a main etching step by plasma for 62 seconds, wherein the plasma is generated from a mixed source gas with a power of 1000 W, and the mixed source gas having a total pressure of 4 mTorr comprises a $Cl_2$ gas having a flow rate of 50 sccm and a HBr gas having a flow rate of 150 sccm; and performing an over-etching step by plasma for 90 seconds, wherein the plasma is generated from a mixed source gas with a power of 400 W, and the mixed source gas having a total pressure of 60 mTorr comprises a HBr gas having a flow rate of 108 sccm and a $HeO_2$ having a flow rate of 8 sccm.

12. The method of claim 10, wherein the material of the conductive layer comprises polysilicon.

13. The method of claim 1, wherein the first conductive layer includes a polysilicon layer.

* * * * *